United States Patent
Lin et al.

(10) Patent No.: US 9,653,423 B2
(45) Date of Patent: May 16, 2017

(54) INTEGRATED CIRCUIT STRUCTURE HAVING DIES WITH CONNECTORS

(71) Applicant: Taiwan Semiconductor Manufacturing Company, Ltd., Hsin-Chu (TW)

(72) Inventors: Jing-Cheng Lin, Hsin-Chu (TW); Cheng-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/079,335

(22) Filed: Mar. 24, 2016

(65) Prior Publication Data

US 2016/0204076 A1  Jul. 14, 2016

Related U.S. Application Data

(63) Continuation of application No. 13/901,279, filed on May 23, 2013, now Pat. No. 9,299,680.

(Continued)

(51) Int. Cl.
*H01L 21/00* (2006.01)
*H01L 23/00* (2006.01)
(Continued)

(52) U.S. Cl.
CPC ........... *H01L 24/81* (2013.01); *H01L 21/486* (2013.01); *H01L 21/4853* (2013.01); *H01L 23/293* (2013.01); *H01L 23/3192* (2013.01); *H01L 23/49811* (2013.01); *H01L 23/49827* (2013.01); *H01L 24/13* (2013.01); *H01L 24/16* (2013.01); *H01L 25/0657* (2013.01); *H01L 25/50* (2013.01); *H01L 24/03* (2013.01); *H01L 24/05* (2013.01); *H01L 24/10* (2013.01); *H01L 24/11* (2013.01); *H01L 2224/0345* (2013.01); *H01L 2224/0346* (2013.01); *H01L 2224/0401* (2013.01); *H01L 2224/05009* (2013.01); *H01L 2224/05022* (2013.01); *H01L 2224/05147* (2013.01); *H01L 2224/05166* (2013.01); *H01L 2224/05181* (2013.01); *H01L 2224/05186* (2013.01); *H01L 2224/05572* (2013.01); *H01L 2224/05582* (2013.01); *H01L 2224/05647* (2013.01); *H01L 2224/1134* (2013.01); *H01L 2224/1145* (2013.01);

(Continued)

(58) Field of Classification Search
CPC ....................................................... H01L 24/81
See application file for complete search history.

(56) References Cited

U.S. PATENT DOCUMENTS

2008/0223906 A1    9/2008 Choi et al.
2011/0001250 A1*   1/2011 Lin ................... H01L 23/49816
                                                    257/778

(Continued)

*Primary Examiner* — William Harriston
(74) *Attorney, Agent, or Firm* — Slater Matsil, LLP

(57) ABSTRACT

An embodiment is an integrated circuit structure including a first die having a bump structure, and a second die having a pad structure. The first die is attached to the second die by bonding the bump structure and the pad structure. The bump structure includes a metal pillar, a metal cap layer on the metal pillar, a metal insertion layer on the metal cap layer, and a solder layer on the metal insertion layer. The pad structure includes at least one of a nickel (Ni) layer, a palladium (Pd) layer or a gold (Au) layer.

20 Claims, 2 Drawing Sheets

Related U.S. Application Data

(60) Provisional application No. 61/783,548, filed on Mar. 14, 2013.

(51) Int. Cl.

| | | |
|---|---|---|
| *H01L 21/48* | (2006.01) | |
| *H01L 23/498* | (2006.01) | |
| *H01L 23/29* | (2006.01) | |
| *H01L 23/31* | (2006.01) | |
| *H01L 25/065* | (2006.01) | |
| *H01L 25/00* | (2006.01) | |

(52) U.S. Cl.
CPC ............... *H01L 2224/1146* (2013.01); *H01L 2224/11452* (2013.01); *H01L 2224/13005* (2013.01); *H01L 2224/13017* (2013.01); *H01L 2224/13018* (2013.01); *H01L 2224/13026* (2013.01); *H01L 2224/13084* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16058* (2013.01); *H01L 2224/16146* (2013.01); *H01L 2224/16225* (2013.01); *H01L 2224/16227* (2013.01); *H01L 2224/16238* (2013.01); *H01L 2224/16503* (2013.01); *H01L 2224/16507* (2013.01); *H01L 2224/32225* (2013.01); *H01L 2224/73204* (2013.01); *H01L 2224/8181* (2013.01); *H01L 2224/81191* (2013.01); *H01L 2224/81815* (2013.01); *H01L 2225/06513* (2013.01); *H01L 2924/15311* (2013.01); *H01L 2924/3656* (2013.01)

(56) References Cited

U.S. PATENT DOCUMENTS

| | | | |
|---|---|---|---|
| 2011/0006415 A1 | 1/2011 | Bachman et al. | |
| 2011/0121442 A1* | 5/2011 | Shen | H01L 21/561 257/686 |
| 2011/0285023 A1* | 11/2011 | Shen | H01L 24/03 257/773 |

* cited by examiner

INTEGRATED CIRCUIT STRUCTURE HAVING DIES WITH CONNECTORS

This application is a continuation of U.S. patent application Ser. No. 13/901,279, filed May 23, 2013, entitled "Integrated Circuit Structure Having Dies with Connectors," which claims the benefit of U.S. Provisional Application Ser. No. 61/783,548, filed on Mar. 14, 2013, entitled "Structure Having Dies with Connectors," which patent applications are incorporated herein by reference.

BACKGROUND

Since the development of the integrated circuit (IC), the semiconductor industry has experienced continued rapid growth due to continuous improvements in the integration density of various electronic components such as transistors, diodes, resistors, capacitors, and the like. For the most part, these improvements in integration density have come from repeated reductions in minimum feature size, which allows more components to be integrated into a given area. These integration improvements are essentially two-dimensional in nature, in that the area occupied by the integrated components is essentially on the surface of the semiconductor wafer. Various techniques have been developed to attempt to incorporate extra dimensionality into IC structures. One technique is referred to as a two and a half dimensional structure. These structures typically have interposers having a die stacked on the interposer. Interposers have been used to redistribute ball contact areas from that of the chip to a larger area of the interposer. Further, interposers have allowed for a package that includes multiple chips. Other techniques stack chips in a three dimensional (3D) structure. This allows for greater functionality with a reduced footprint of the structure.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to integrated circuit structures, which can be two half dimensional integrated circuit (2.5DIC) structures, three dimensional integrated circuit (3DIC) structures or other structures.

Figure 1:
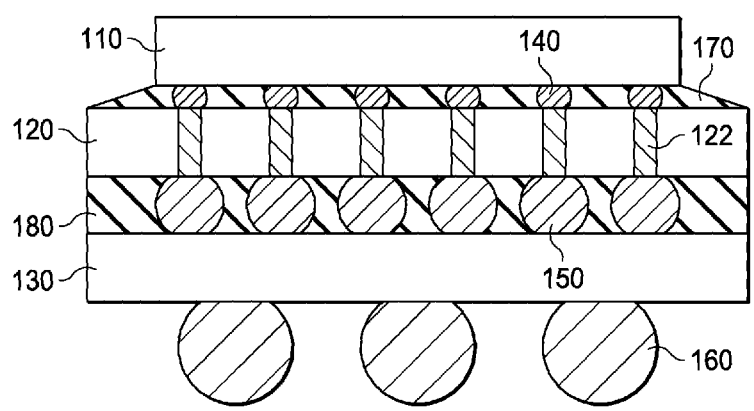
FIG. 1 is a cross-sectional diagram illustrating an integrated circuit structure according to an embodiment.

FIG. 1 illustrates an integrated circuit structure 100 according to an embodiment. The structure 100 comprises a first die 110 and a second die 120 attached to each other by a plurality of first connectors 140, and a workpiece 130 attached to the second die 120 through a plurality of second connectors 150. The workpiece 130 includes a plurality of third connectors 160 formed on one side opposite to the side attached to the second die 120, for connecting other substrates or devices.

In some embodiments, the first die 110 is a die having a low density of inputs and outputs, such as a dynamic random access memory (DRAM) die, a memory stack of dies, a radio frequency signal processing die, or the like. In other embodiments, the first die 110 is a die having a high density of inputs or outputs, such as a graphics processing unit (GPU) die, a logic device die, or the like. In some embodiments, the second die 120 is an active die, such as a DRAM die, a radio frequency signal processing die, a logic device die, a GPU die, or the like. In an embodiment, the second die 120 is an interposer free of active devices. In an embodiment, the second die 120 includes through substrate vias (TSVs), also referred to as through silicon vias, 122 electrically connected to the first die 110 and/or the substrate 130. The sizes of the first die 110 and the second die 120 may be the same or different depending on varies in circuit designs and process flow controls. In embodiments, the workpiece 130 is a package substrate, an organic substrate, or a semiconductor substrate. In embodiments, a first underfill material 170 is between the first die 110 and the second die 120, and a second underfill material 180 is between the second die 120 and the substrate 130. It should be noted that the underfill materials 170 and 180 are optional in the integrated circuit structure 100.

In embodiments, bumps and/or pad structures are formed on the first die 110 and the second die 120, and the jointed bumps and/or pad structures form the first connectors 140 to provide electrical connection and physical support between the dies 110 and 120. In embodiments, the bumps formed on the dies 110 and/or 120 are micro bumps or controlled collapse chip connection (C4) bumps. One side of the workpiece 130 is attached to the second die 120 by the second connectors 150, such as C4 bumps, and the other side of the workpiece 130 has the third connectors 160, such as ball grid array (BGA) balls. In embodiments, a size and pitch of the third connectors 160 is larger than a size and a pitch of the second connectors 150, respectively. In embodiments, a size and pitch of the second connectors 150 is larger than a size and a pitch of the first connectors 140, respectively.

Figure 2:
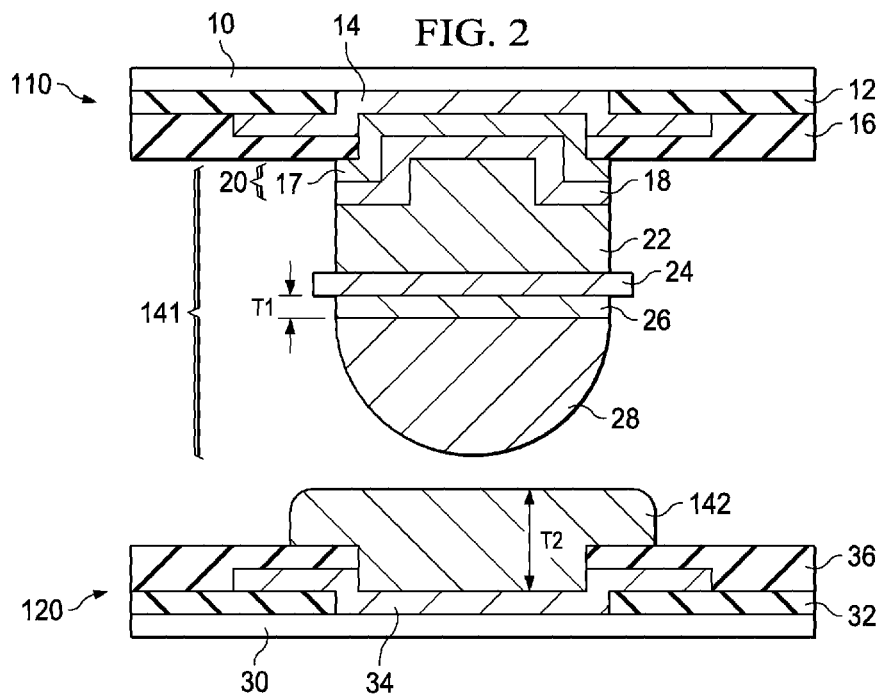
FIG. 2 is a cross-sectional diagram illustrating bumps and pad structures on dies of an integrated circuit structure according to an embodiment.

FIG. 2 illustrates the formation of the bumps and pad structures on the first die 110 and the second die 120 before attaching the first die 110 to the second die 120.

The first die 110 includes a first substrate 10, a first passivation layer 12 covering the first substrate 10, a post-passivation interconnect (PPI) layer 14 formed through an opening in the first passivation layer 12, a first protective layer 16 covering the first passivation layer 12 and a portion of the PPI layer 14, and a bump structure 141 over the first protective layer 16 electrically coupling the PPI layer 14.

An example of the first substrate 10 may include a semiconductor substrate as employed in a semiconductor integrated circuit fabrication, and integrated circuits may be formed therein and/or thereupon. The term semiconductor substrate contemplates any construction comprising semiconductor materials, including, but not limited to, bulk silicon, a semiconductor wafer, a silicon-on-insulator (SOI)

substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The substrate 10 further includes inter-layer dielectric layers and a metallization structure overlying the integrated circuits.

In embodiments, the first passivation layer 12 is formed of a non-organic material selected from un-doped silicate glass (USG), silicon nitride, silicon oxynitride, silicon oxide, and combinations thereof. In other embodiments, the first passivation layer 12 is formed of a polymer layer, such as an epoxy, polyimide, benzocyclobutene (BCB), polybenzoxazole (PBO), and the like, although other relatively soft, often organic, dielectric materials can also be used. The first passivation layer 12 may be a single layer or a multi-layered structure.

In embodiments, the PPI layer 14 is a metallization structure electrically coupled a metallization layer within the first substrate 10. For example, the PPI layer 14 is formed by initially forming a seed layer (not shown), such as a titanium (Ti) layer, a tantalum (Ta) layer, a tantalum nitride (TaN) layer, a copper (Cu) layer or a Cu alloy layer, and then plating a conductive material layer, such as an aluminum (Al) layer, a Cu layer, a AlCu layer, a gold (Au) layer, or combinations thereof. The pattern of the PPI layer 14 can be defined by a suitable photolithographic mask and etching process. In some embodiments, the PPI layer 14 may also function as power lines, re-distribution lines (RDL), inductors, capacitors or any passive components.

The first protective layer 16 may be formed from a polymer such as polyimide, or may be formed of silicon oxide, silicon nitride, low-k dielectric, extremely low-k dielectric, the like, or a combination thereof. An opening is made through the first protective layer 16 by removing portions of the first protective layer 16 to expose at least a portion of the underlying PPI layer 14. The opening is formed using, for example, a suitable photolithographic mask and etching process.

The bump structure 141 is over the first protective layer 16 and electrically coupled the PPI layer 14 through the opening formed in the first protective layer 16. In embodiments, the bump structure 141 includes an under-bump metallization (UBM) layer 20 in an opening through the first protective layer 16 electrically coupling the PPI layer 14, a metal pillar 22 on the UBM layer 20, a metal cap layer 24 on the metal pillar 22, a metal insertion layer 26 on the metal cap layer 24, and a solder layer 28 on the metal insertion layer 26.

In embodiments, the UBM layer 20 is formed in electrical contact with the PPI layer 14. The UBM layer 20 may be formed of titanium, titanium nitride, tantalum, tantalum nitride, tungsten, titanium tungsten, nickel, gold, chrome, copper, or copper alloy. Any suitable materials or layers of material that may be used for the UBM are fully intended to be included within the scope of the current application. In embodiments, the UBM layer 20 includes a first metallization layer 17 and a second metallization layer 18. For example, the first metallization layer 17 is an adhesion (or a metal barrier) layer formed of titanium or titanium nitride, and the second metallization layer 18 is a seed layer formed of copper. The UBM layer 20 may be created by forming a metallization layer over the first protective layer 16 and in the opening in the first protective layer 16 using, for example, plating, sputtering, evaporation, or PECVD process. Once the metallization layer has been formed, portions of the metallization layer may then be removed through a suitable photolithographic masking and etching process to remove the undesired material and to leave the UBM layer 20 in a desired shape, such as a circular, octagonal, square, or rectangular shape, although any desired shape may alternatively be formed.

The metal pillar 22 is a copper pillar formed on the UBM layer 20 according to some embodiments. The copper pillar is intended to include substantially a material including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the thickness of the metal pillar 22 is greater than about 5 μm. For example, the thickness of the metal pillar 22 is about 8 μm to about 10 μm. In other embodiments, the thickness of the metal pillar 22 is greater than about 10 μm or greater than about 20 μm, although the thickness may be greater or smaller.

The metal cap layer 24 is formed on the top of the metal pillar 22. The metal cap layer 24 may include nickel, tin, tin-lead (SnPb), gold (Au), silver, palladium (Pd), indium (In), nickel-palladium-gold (NiPdAu), nickel-gold (NiAu) or other similar materials or alloy. In an embodiment, the metal cap layer 24 is a nickel layer, an Au layer, or a NiAu layer by plating. In an exemplary embodiment, the thickness of the metal cap layer 24 is about 1 μm to about 5 μm, although the thickness may be greater or smaller.

The metal insertion layer 26 is formed on the top of the metal cap layer 24. In an embodiment, the metal insertion layer 26 is a copper layer. The copper layer is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, a thickness T1 of the metal insertion layer 26 is equal to or greater than about 1.5 μm, although the thickness may be greater or smaller. For example, the thickness T1 is in the range from about 1.5 μm to about 5 μm.

The solder layer 28 is then formed on the top of the metal insertion layer 26. In embodiments, the solder layer 28 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape.

According to some embodiments, the second die 120 includes a second substrate 30, a second passivation layer 32 covering the second substrate 30, a metal layer 34 formed through an opening in the second passivation layer 32, a second protective layer 36 covering the second passivation layer 32 and a portion of the metal layer 34, and a pad structure 142 over the second protective layer 36 electrically coupling the metal layer 34.

In embodiments, the second passivation layer 32 is formed of a non-organic material selected from un-doped silicate glass (USG), silicon nitride, silicon oxynitride, silicon oxide, and combinations thereof. In other embodiments, the second passivation layer 32 is formed of a polymer layer, such as an epoxy, polyimide, benzocyclobutene (BCB), polybenzoxazole (PBO), and the like, although other relatively soft, often organic, dielectric materials can also be used. The second passivation layer 32 may be a single layer or a multi-layered structure.

In embodiments, the metal layer 34 is a portion of conductive routes and has an exposed surface not covered by the second protective layer 36. The metal layer 34 is a top-level metal layer of an interconnect structure formed on the second substrate 30 according to some embodiments. Suitable materials for the metal layer 34 may include, but are not limited to, for example copper, aluminum, copper alloy, aluminum alloy, or other mobile conductive materials, although it may also be formed of, or include, other materials such as copper, silver, gold, nickel, tungsten, alloys thereof, and/or multi-layers thereof.

In embodiments, the pad structure 142 is formed over the second protective layer 36 and the exposed surface of the metal layer 34. In an embodiment, the pad structure 142 is formed of a conductive material which does not include copper. In embodiments, the pad structure 142 includes nickel (Ni), tin, tin-lead (SnPb), gold (Au), silver, palladium (Pd), indium (In), nickel-palladium-gold (NiPdAu), nickel-gold (NiAu), a Ni-based alloy, an Au-based alloy, a Pd-based alloy, or other similar materials by an electroless plating process or an immersion plating process. The pad structure 142 has a thickness T2 about 1 µm to about 10 µm. In an embodiment, the pad structure 142 is a triple-layer structure including an electroless Ni layer, an electroless Pd layer, and an immersion Au layer, which is also known as an ENEPIG structure. For example, the ENEPIG structure may have the electroless Ni layer with a thickness of at least 1 µm, the electroless Pd layer with a thickness of at least 0.02 µm and the immersion Au layer with a thickness of at least 0.01 µm. In an embodiment, the pad structure 142 is a dual-layer structure including an electroless Ni layer and an electroless Pd layer, named an ENEP structure. In an embodiment, the pad structure 142 is a single-layer structure including an electroless Ni layer, which is also known as an EN structure. In an embodiment, the pad structure 142 is a dual-layer structure including an electroless Ni layer and an immersion Au layer, which is also known as an ENIG structure.

Once the bump structure 141 is formed on the first die 110 and the pad structure 142 is formed on the second die 120, the first die 110 is attached to the second die 120, such as by bonding the bump structure 141 and the pad structure 142. In an embodiment, the solder layer 28 is reflowed and bonded to the pad structure 142 form a permanent connection between the first die 110 and the second die 120, thus forming the first connector 140 as illustrate in FIG. 1.

Figure 3:
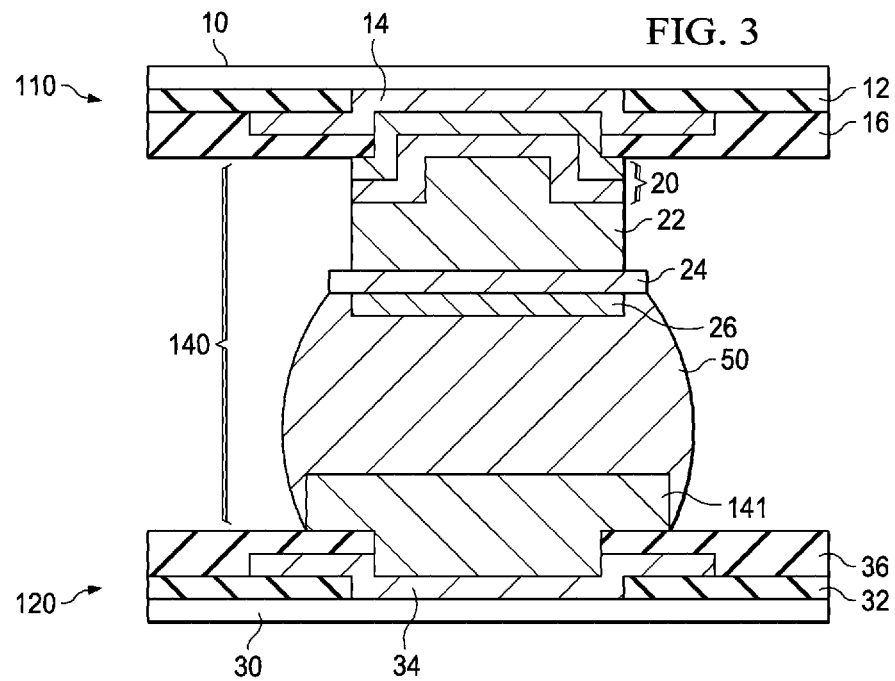
FIG. 3 is a cross-sectional diagram illustrating a connector between dies of an integrated circuit structure according to an embodiment.

FIG. 3 illustrates an example of the formation of the first connector 140 shown in FIG. 1. The structures of FIG. 2 are brought together and the solder layer 28 and the pad structure 142 are bonded, such that the solder layer 28 becomes a solder joint portion 50 between the metal insertion layer 26 and the pad structure 142. A height of the first connector 140 between the first die 110 and the second die 120 can be between approximately 20 µm and approximately 30 micrometers.

Figure 4:
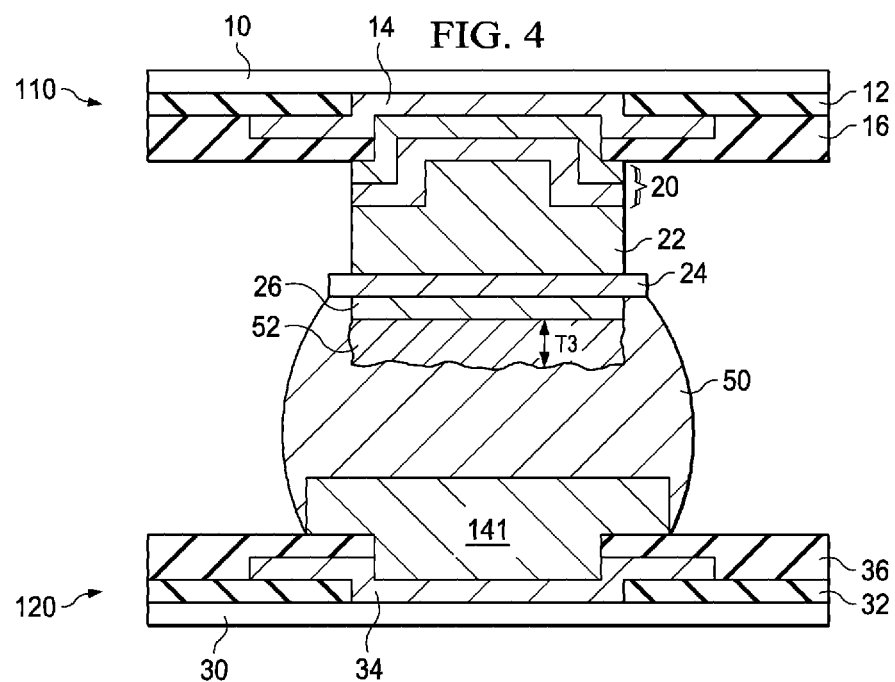
FIG. 4 is a cross-sectional diagram illustrating an intermetallic compound (IMC) layer in a connector of the integrated circuit structure according to an embodiment.

During thermal cycling, the tin in the solder joint portion 50 tends to migrate through cracks or other defects and react with the underlying layer (such as the metal insertion layer 26) to form an intermetallic compound (IMC) layer, and the metal insertion layer 26 may be consumed during the IMC formation. FIG. 4 illustrates an example of the formation of IMC layers in the first connector 140 shown in FIG. 3. In some embodiments, an IMC layer 52 is formed at the interface between the metal insertion layer 26 and the solder joint portion 50. In embodiments, the IMC layer 52A includes $Cu_6Sn_5$, $(Cu, Pd, Au)_6Sn_5$, $(Cu, Pd)_6Sn_5$, $(Cu, Au)_6Sn_5$ and/or $Cu_3Sn$, $(Cu, Pd, Au)_3Sn$, $(Cu, Pd)_3Sn$, $(Cu, Au)_3Sn$. In an exemplary embodiment, a thickness T3 of the IMC layer 52 is between about 3 µm and about 5 µm, although the thickness may be greater or smaller. In the first connector 140, the metal insertion layer 26 can reduce solder source and interrupt the path of solder diffusion. It is experimentally observed that the IMC growth rate of $Cu_6Sn_5$ and $Cu_3Sn$ is three times faster than that of $Ni_3Sn_4$. Thereby, no solder wetting is observed on sidewalls of the metal pillar and void formation in the solder joint portion is minimized and/or eliminated. The device performance can be significantly improved by void reduction in the solder joint portion, and the improvements are observed in reliability testing, such as TCT (temperature cycling test) and HTS (high temperature storage) test.

An embodiment is an integrated circuit structure including a first die having a bump structure, and a second die having a pad structure. The first die is attached to the second die by bonding the bump structure and the pad structure. The bump structure includes a metal pillar, a metal cap layer on the metal pillar, a metal insertion layer on the metal cap layer, and a solder layer on the metal insertion layer. The pad structure includes at least one of a nickel (Ni) layer, a palladium (Pd) layer or a gold (Au) layer.

Another embodiment is an integrated circuit structure including a first die attached to a second die by a first connector. The first connector includes a solder joint portion between a nickel layer and a pad structure, and a copper layer between the nickel layer and the solder joint portion. The pad structure includes at least one of a nickel (Ni) layer, a palladium (Pd) layer or a gold (Au) layer.

A further embodiment is an integrated circuit structure including a first die attached to a second die through a first connector, and a workpiece attached to the second die through a second connector. The first connector includes a copper layer between a copper pillar and a pad structure, a nickel layer between the copper pillar and the copper layer, a solder layer between the copper layer and the pad structure, and an intermetallic compound (IMC) layer between the copper layer and the solder layer. The pad structure includes at least one of a nickel (Ni) layer, a palladium (Pd) layer or a gold (Au) layer.

Although the present embodiments and their advantages have been described in detail, it should be understood that various changes, substitutions and alterations can be made herein without departing from the spirit and scope of the disclosure as defined by the appended claims. For example, although the foregoing embodiments were discussed with respect to structures comprising two dies, embodiments can have any number of dies with any combination of connectors attaching those dies.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a conductive interconnect over a first die;
depositing a conductive pillar having a first conductive material over the conductive interconnect, the conductive pillar being electrically coupled to the conductive interconnect;
depositing a first cap layer on the conductive pillar, the first cap layer having a different material composition than the conductive pillar;
depositing a second cap layer having the first conductive material on the first cap layer, the second cap layer having a different material composition than the first cap layer;
forming a solder layer on the second cap layer; and
forming an intermetallic compound (IMC) between the solder layer and the second cap layer, the IMC comprising copper (Cu) and being substantially free of nickel (Ni).

2. The method of claim 1 further comprising:
forming a pad structure over a second die; and
bonding the solder layer of the first die to the pad structure of the second die.

3. The method of claim 2, wherein the pad structure comprises at least one of a nickel (Ni) layer, a palladium (Pd) layer and a gold (Au) layer.

4. The method of claim 2, wherein the first die is an active die comprising active devices, and the second die is an interposer free of active devices.

5. The method of claim 2 further comprising:
forming a through substrate via extending through the second die.

6. The method of claim 2 further comprising:
forming a metal layer comprising copper over a substrate of the second die, the pad structure overlying the metal layer.

7. The method of claim 1 further comprising:
forming an under-bump metallization (UBM) layer over and electrically coupled to the conductive interconnect, the conductive pillar being over and electrically coupled to the UBM layer.

8. The method of claim 1, wherein the first conductive material is copper.

9. The method of claim 1, wherein the IMC has a thickness between about 3 μm and about 5 μm.

10. A method comprising:
forming post-passivation interconnect over a first die;
forming an under-bump metallization (UBM) layer over and electrically coupled to the post-passivation interconnect;
depositing a conductive pillar over the UBM layer, the conductive pillar being electrically coupled to the UBM layer;
depositing a first cap layer on the conductive pillar, the first cap layer having a different material composition than the conductive pillar;
depositing a second cap layer on the first cap layer, the second cap layer having a different material composition than the first cap layer;
forming a solder layer on the second cap layer; and
forming an intermetallic compound (IMC) between the solder layer and the second cap layer, the second cap layer completely separating the IMC from the first cap layer.

11. The method of claim 10, wherein the conductive pillar and the second cap layer each comprise copper (Cu).

12. The method of claim 10, wherein the first cap layer comprises nickel (Ni).

13. The method of claim 10 further comprising:
forming a pad structure over a second die; and
bonding the solder layer of the first die to the pad structure of the second die.

14. The method of claim 13, wherein the pad structure comprises at least one of a nickel (Ni) layer, a palladium (Pd) layer and a gold (Au) layer.

15. The method of claim 10, wherein the IMC comprises copper (Cu) and is substantially free of nickel (Ni).

16. The method of claim 10, wherein the first cap layer is wider than the conductive pillar, and wherein the second cap layer is narrower than the first cap layer.

17. The method of claim 10, wherein the second cap layer has a thickness greater than about 1.5 μm.

18. A structure comprising:
a conductive interconnect over a first die;
a conductive pillar comprising a first conductive material over and electrically coupled to the conductive interconnect;
a first cap layer on the conductive pillar, the first cap layer having a different material composition than the conductive pillar;
a second cap layer comprising the first conductive material on the first cap layer, the second cap layer having a different material composition than the first cap layer;
a solder layer on the second cap layer; and
an intermetallic compound (IMC) disposed between the solder layer and the second cap layer, the IMC comprising copper (Cu) and being substantially free of nickel (Ni).

19. The structure of claim 18, wherein the conductive pillar and the second cap layer each comprise copper (Cu).

20. The structure of claim 18 further comprising:
a pad structure on a second die, the first die being attached to the second die by the solder layer being bonded to the pad structure.

* * * * *